(12) United States Patent
Huang et al.

(10) Patent No.: US 9,314,861 B2
(45) Date of Patent: Apr. 19, 2016

(54) TEMPERATURE TRIGGERING EJECTOR MECHANISM FOR LOCK PIN SOLDERING TYPE COMPONENT

(71) Applicant: GLOBALFOUNDRIES INC., Grand Cayman (KY)

(72) Inventors: Xiaowei Huang, Shenzhen (CN); Ke Pu, Shenzhen (CN); WeiFeng Zhang, Shenzhen (CN); Shou De Zhen, Shenzhen (CN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/286,015

(22) Filed: May 23, 2014

(65) Prior Publication Data

US 2014/0353360 A1    Dec. 4, 2014

(30) Foreign Application Priority Data

May 31, 2013   (CN) .......................... 2013 1 0211822

(51) Int. Cl.
| | |
|---|---|
| *B23K 37/04* | (2006.01) |
| *B23K 1/00* | (2006.01) |
| *B23K 3/08* | (2006.01) |
| *H05K 3/22* | (2006.01) |
| *H05K 3/30* | (2006.01) |

(52) U.S. Cl.
CPC ............... *B23K 1/0016* (2013.01); *B23K 3/08* (2013.01); *B23K 37/04* (2013.01); *H05K 3/225* (2013.01); *H05K 3/308* (2013.01); *H05K 2201/09572* (2013.01); *H05K 2203/0195* (2013.01); *H05K 2203/1581* (2013.01); *H05K 2203/176* (2013.01)

(58) Field of Classification Search
CPC ........ B23K 1/0016; B23K 37/04; B23K 3/08; H05K 2201/09572; H05K 2203/0195; H05K 2203/1581; H05K 2203/176; H05K 3/225; H05K 3/308
USPC .......................................................... 228/119
See application file for complete search history.

(56) References Cited

U.S. PATENT DOCUMENTS

| | | | |
|---|---|---|---|
| 3,059,627 A | 10/1962 | Dadd | |
| 4,436,358 A * | 3/1984 | Coldren | ................. H01R 9/091 439/742 |
| 4,602,733 A * | 7/1986 | Slack | ..................... B23K 1/018 219/85.15 |
| 4,686,766 A * | 8/1987 | Dubbs | ................. B29C 45/0003 264/165 |
| 4,865,536 A | 9/1989 | Inaba et al. | |
| 5,411,404 A * | 5/1995 | Korsunsky | ............. H01R 9/091 439/108 |
| 5,518,162 A | 5/1996 | Deschenes et al. | |
| 5,979,042 A * | 11/1999 | Duke | ..................... H05K 3/225 29/739 |

(Continued)

*Primary Examiner* — Devang R Patel
*Assistant Examiner* — Carlos Gamino
(74) *Attorney, Agent, or Firm* — Thompson Hine LLP (57) ABSTRACT

A temperature triggering ejector system for lock pin soldering type component is provided. There is provided a temperature triggering ejector system for a lock pin soldering type component, lock pins of said component are fixed in through holes of a circuit board and solder is filled in the through holes after soldering, said system comprising: an ejector that is located at one side of the circuit board that is opposed to said component, and has ejector pins aligned with the through holes of the circuit board and a cylinder that drives the ejector pins; a temperature sensor for sensing the temperature of said solder being heated; a controller for driving the ejector pins of the ejector within a solder melting temperature range based on the temperature sensed by the temperature sensor, to eject the lock pins of said component from said circuit board.

16 Claims, 6 Drawing Sheets

(56) References Cited

U.S. PATENT DOCUMENTS

| | | | |
|---|---|---|---|
| 6,186,216 B1 * | 2/2001 | Bolde | H01L 21/4853 164/131 |
| 6,276,596 B1 * | 8/2001 | Gruber | B23K 3/0638 228/180.22 |
| 6,349,871 B1 * | 2/2002 | Card, Jr. | B23K 1/012 228/119 |
| 6,607,113 B2 | 8/2003 | Cilia et al. | |
| 6,796,026 B2 | 9/2004 | Pupin et al. | |
| 6,957,484 B2 | 10/2005 | Pupin et al. | |
| 7,815,096 B2 | 10/2010 | Hamilton | |
| 2003/0107881 A1 * | 6/2003 | Muramatsu | H01Q 1/1207 361/818 |
| 2005/0019654 A1 * | 1/2005 | Kishida | H01M 2/1044 429/178 |
| 2011/0151041 A1 | 6/2011 | Groleau | |

\* cited by examiner

FIG.1

PRIOR ART

TEMPERATURE TRIGGERING EJECTOR MECHANISM FOR LOCK PIN SOLDERING TYPE COMPONENT

BACKGROUND

The present invention generally relates to a field of manufacturing of electronic products, and more specifically, to a rework method and a temperature triggering ejector mechanism for a lock pin soldering type component.

Currently, for assembling of an electronic product, the process including the following steps is generally adopted: print→mount→reflow solder→wash→check→rework. When a defect is detected in an electronic product, the electronic product is not directly scrapped, but reworked. The electronic product is reworked to eliminate the defect, so as to improve the yield and reduce the production cost.

Figure 1:
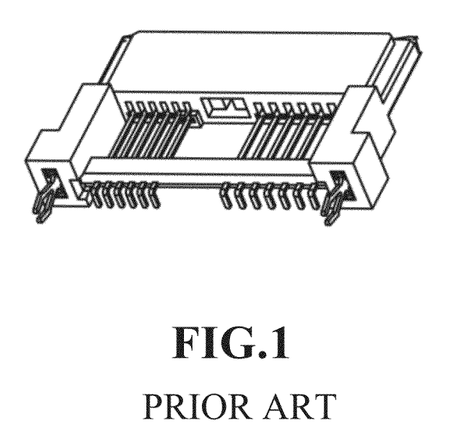
FIG. 1 shows a perspective view of an electronic component with lock pins to be mounted to a circuit board.

Lock pin are configured in some components of the electronic product to provide extra mechanical strength for the interconnection between the components and a circuit board (or an electronic card assembly). Such lock pins are fixed (stuck) in through holes (such Plating Through Holes (PTHs) of the circuit board (such as Printed Circuit Board (PCB)). FIG. 1 shows a perspective view of an electronic component with lock pins, which is to be mounted on a circuit board.

Figure 2:
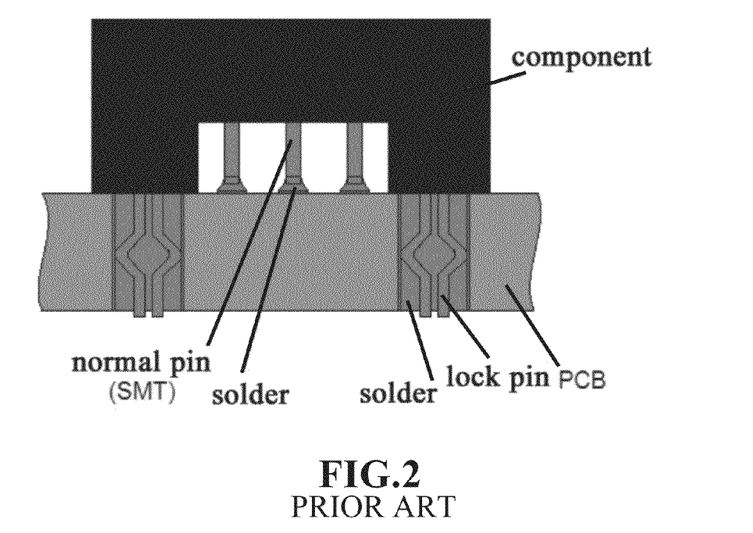
FIG. 2 is a schematic diagram showing an electronic product that has been finished manufacturing.

FIG. 2 is a schematic diagram showing an electronic product that has been finished manufacturing. In FIG. 2, lock pins of the component in the upper portion are stuck at through holes of the PCB in the lower portion. There are "fish-eye" portions bending outwards in the middle of lock pins. The overall width of "fish-eye" portions is slightly larger than the diameter of through holes, so that when lock pins are inserted into through holes, lock pins are compressed and deformed to generate elastic force in a direction that is opposed to the direction of deformation. With the elastic force, lock pins will push against the hole walls of through holes. In this way, when the component is being pulled up from the circuit board, friction force will be generated between lock pins and hole walls of through holes. This friction force ensures that the component is firmly fixed on the circuit board. However, during a rework process, this friction force makes it difficult to remove the component from the circuit board, and may cause damage to the component or the circuit board.

Figure 3:
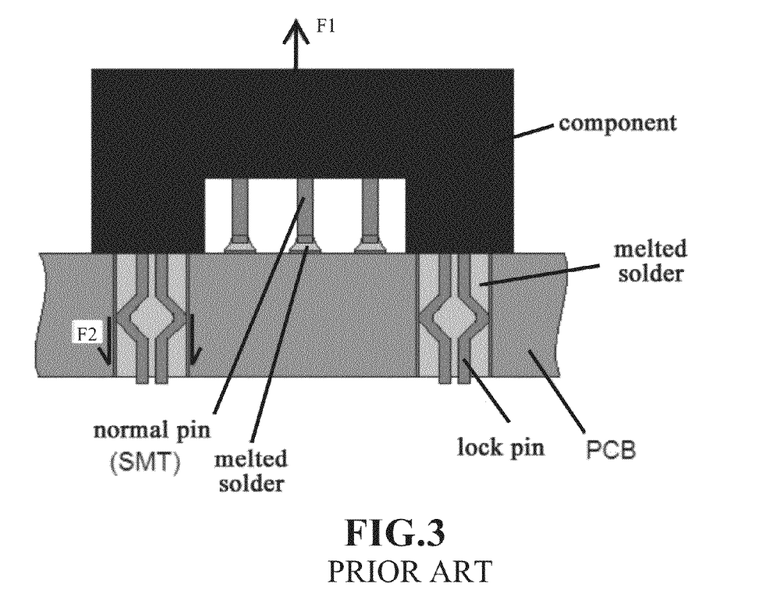
FIG. 3 is a schematic diagram showing an electronic product during a rework process in accordance with an illustrative embodiment.

FIG. 3 is a schematic diagram showing the electronic product in FIG. 2 during a rework process. In FIG. 3, when removal force F1 is applied to the component in the upper portion of FIG. 3, friction force F2 will be generated in the PTH in a direction that is opposed to the direction of the removal force F1.

In addition, FIG. 2 shows that plating through holes are filled with solder that has been solidified after soldering. Solder also exists between normal pins (Surface Mounted Technology (SMT)) and the circuit board. With lock pins and soldering, the component is fixed on the circuit board more firmly. However, the design of soldering lock pins to PTH holes is a challenge to the rework process. During the rework process, a soldered part needs to be heated by hot gas to melt the solder so that the component can be pulled up from the circuit board. Solder that is heated and melted is shown in FIG. 3.

Currently, in the electronic product assembling industry, known solutions to remove the lock pin type component during the rework process include: manually removing the component body by hand, and a mechanical extractor that grabs hold of the component body and pulls it up, etc. All these existing solutions have limitations as follows: during the elevated solder melting temperature, because of elevation of the temperature (in comparison with the room temperature), the component body will soften and may not provide sufficient pull up force for lock pins of the component; timing for applying the pull up force is not controlled, which however is critical, because application of the pull up force in a case where the solder is cold and solid may cause damage to PTH holes, and/or the component.

In the prior art methods, there is a risk of component removal failure. The failure to remove the component with lock pins or any damages to the PTH holes during component removal may mean a scrap of the entire circuit board.

SUMMARY

Thus, in order to solve the above problems, a better solution to remove the soldering type component with lock pins from the circuit board during the rework process is required.

According to one illustrative embodiment, there is provided a temperature triggering ejector system for a lock pin soldering type component, lock pins of said component are fixed in through holes of a circuit board and solder is filled in the through holes after soldering, the system comprising: an ejector that is located at one side of the circuit board that is opposed to the component, and has ejector pins aligned with the through holes of the circuit board and a cylinder that drives the ejector pins; a temperature sensor for sensing the temperature of the solder being heated; a controller for driving the ejector pins of the ejector within a solder melting temperature range based on the temperature sensed by the temperature sensor, to eject the lock pins of the component from the circuit board.

According to another illustrative embodiment, there is provided a rework method for a circuit board with a lock pin soldering type component, lock pins of the component are fixed in through holes of the circuit board and solder is filled in the through holes after soldering, the method comprising; heating a rework area in which there is solder on the circuit board; using a temperature sensor to sense the temperature of said solder being heated; driving ejector pins of an ejector within a solder melting temperature range based on the temperature sensed by the temperature sensor, to eject the lock pins of said component from the circuit board, wherein the ejector is located at one side of the circuit board that is opposed to the component and has ejector pins aligned with the through holes of the circuit board and a cylinder that drives the ejector pins.

By employing the temperature triggering ejector system and the rework method of the above embodiments, it is possible to improve the success rate for removing a component with lock pins from a circuit board, and to eliminate the potential scrap cost induced by the component removal failure during the rework process, so as to improve the yield and reduce the average manufacturing cost. Additionally, by employing the temperature triggering ejector system and the rework method of the illustrative embodiments, it is possible to achieve an automatic process with consistent quality result.

BRIEF DESCRIPTION OF THE SEVERAL VIEWS OF THE DRAWINGS

Upon reading the following detailed description of exemplary embodiment in conjunction with the accompanying drawings, the present invention itself, embodiments, other objects and advantages thereof will be better understood. In the accompanying drawings.

Now, preferred methods and systems are described with reference to drawings wherein the same reference numbers are used to indicate the same elements in the drawings. In the following description, for an explanatory purpose, many specific details are set forth in order to help fully understand systems and methods, etc. In other examples, in order to simplify the description, commonly used structures and devices are illustrated in a form of block diagram. Many modifications and other embodiments may be conceived of by those skilled in the art, which own the benefits taught in the specification and drawings as well. Therefore, it should be understood that the present invention is not limited to disclosed specific embodiments, and additional possible embodiments should be contained in the scope and exemplary inventive concept of the present invention. Although some specific terms are used herein, they are simply used in a general descriptive sense but not for a limiting purpose.

DETAILED DESCRIPTION

In the following discussion, numerous specific details are set forth in order to provide a thorough understanding of the present invention. However, it is apparent to those skilled in the art that understanding of the present invention may not be affected even without these specific details. Also, it is to be recognized that any of the following specific terms are merely used for convenience of description. Thus, the present invention should not be limited to be only used in any specific applications denoted and/or implied by such terms.

Although two shapes of lock pins are shown in FIGS. 1 and 2 and the shape of lock pins in FIG. 2 is described as an example in the following embodiment, it should be understood that the term "lock-pin" used herein is not limited thereto. Any similar lock mechanism that can work to increase the friction force for fixing is an object to which the present invention may be applied.

Figure 4:
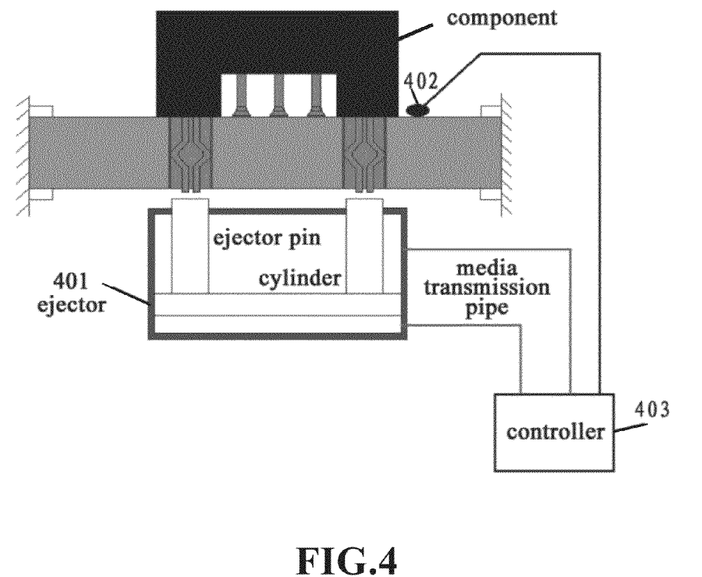
FIG. 4 is a schematic diagram showing a temperature triggering ejector system for a lock pin soldering type component according to an illustrative embodiment.

FIG. 4 is a schematic diagram showing a temperature triggering ejector system for a lock pin soldering type component according to one illustrative embodiment. In FIG. 4, lock pins of the component are fixed in plating through holes (PTH holes) of the printed circuit board (PCB) and solder is filled in the through holes after soldering. The system in FIG. 4 includes an ejector 401, a temperature sensor 402 and a controller 403. The ejector 401 is located at one side of the circuit board that is opposed to the component, and has ejector pins aligned with through holes of the circuit board and a cylinder that drives the ejector pins. The temperature sensor 402 is used to sense the temperature of solder being heated. The controller 403 drives ejector pins of the ejector 401 within a solder melting temperature range based on the temperature sensed by the temperature sensor 402, to eject lock pins of the component from the circuit board.

Figure 5:
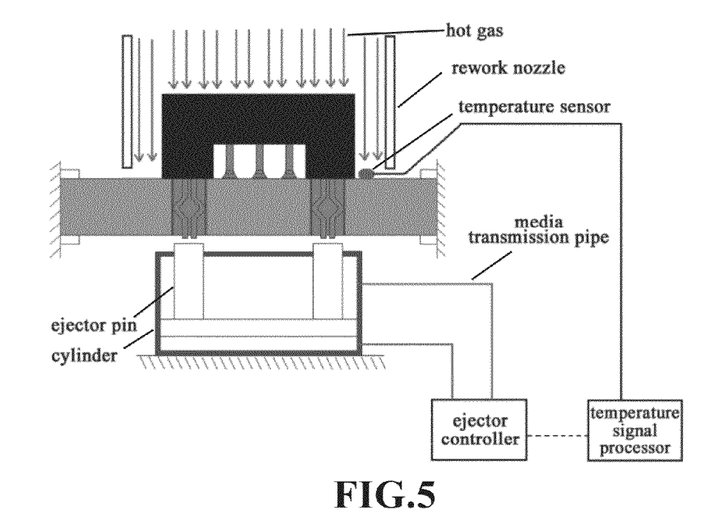
FIG. 5 is a schematic diagram showing a temperature triggering ejector system for a lock pin soldering type component according to another illustrative embodiment.

FIG. 5 is a schematic diagram showing a temperature triggering ejector system for a lock pin soldering type component according to an illustrative embodiment. The temperature triggering ejector system in FIG. 5 differs from the temperature triggering ejector system in FIG. 4 in that, the controller 403 is divided into two parts: an ejector controller EC and a temperature signal processor TSP. Whether the ejector controller and the temperature signal processor are integrated into a single controller (FIG. 4) or the ejector controller and the temperature signal processor work as separate components (FIG. 5), they fall within the protection scope of the present invention. In addition, FIG. 5 also shows a device that heats the electronic product during the rework process, i.e., a rework nozzle. During the rework process, the rework nozzle approaches the circuit board. The circuit board is heated by hot gas ejected from the rework nozzle so that solder is incited. This heating device exists in the prior art and does not belong to a part of the temperature triggering ejector system of the present invention. For example, in the example of the mechanical extractor, the same or similar heating device is also used to heat the circuit board.

In FIG. 5, the cylinder of the ejector is connected to the ejector controller via a media transmission pipe (in FIG. 4, it is connected to the controller 403). The cylinder of the ejector is a container to provide the movement space for the ejector pins, and to provide the necessary seal for the ejector transmission media. The ejector transmission media may be gas or liquid that can normally work, under a heating temperature of 250~300° C. for example for example, for SAC305 alloy solder usually used for the lead-free requirement). The ejector pins are set to be aligned with lock pins of the rework component (that is, aligned with the PTH holes of the circuit board), and the pitch of the ejector pins is also set to be the same as the pitch of the lock pins. The size of the ejector pins is designed to be smaller than the size of the PTH holes, so that the ejector pins can be inserted into the PTH holes.

Under the control of the ejector controller (controller 403), using gas or liquid within the cylinder, the ejector pins are driven in the ejecting direction by the hydraulic pressure or pneumatic pressure, to eject lock pins of the component from the circuit board.

The ejector controller is used to control movement direction and movement speed of the ejector pins, and is linked to the ejector cylinder via the media transmission pipe. The ejector controller controls movement of the ejector pins by compressing hydraulic liquid or pneumatic gas. In another embodiment, the ejector controller may also be equipped with a media input port and a media output port (see FIG. 7 to be described later). Action of the ejector controller is activated according to the electrical signal output from the temperature signal processor. The ejector controller may include various control valves required to control movement of the ejector pins. The ejector controller may also include a pressure relief value to prevent over pressure applied on the ejector pins.

During the process of heating by hot gas, the temperature signal processor receives and monitors the temperature signal from the temperature sensor (such as a thermocouple, etc.) in real time, and sends an "Activate" signal to the ejector controller to control movement of the ejector pins accordingly. The temperature sensor will be placed on the PCB surface close to the component site, in order to measure the temperature of the component site during the rework process. While the temperature sensor is placed on the upper side of the circuit board in examples of FIGS. 4 and 5, to practice, the temperature sensor may be placed on either side of the circuit board. In one embodiment, during the rework, process, the temperature sensor may be placed anywhere, as long as the temperature sensed by the temperature sensor can reflect the temperature of solder being heated. The temperature sensed by the temperature sensor will be the representative temperature of the lock pins. The temperature signal processor will compare the temperature indicated by the temperature signal from the temperature sensor with a predefined threshold, and if the temperature indicated by the temperature signal reaches the predefined threshold, send the "Activate" signal to the ejector controller. For example, for the LF SAC305 solder, the predefined threshold may be set to 220° C. For different kinds of solders, different thresholds may be set.

If the ejector pins are activated too early, stress will be applied to the PTH holes in a case where solder is still in a solid state, thus the PTH holes will be damaged; and if the ejector pins are activated too late, stress will also be applied to the PTH holes because solder has been cooled to be in a solid state. However, by employing the ejector system of the illustrative embodiments, the starting time of the ejector pins' movement can be controlled, so that the ejector pins are driven only within the solder melting temperature range.

Figure 6:
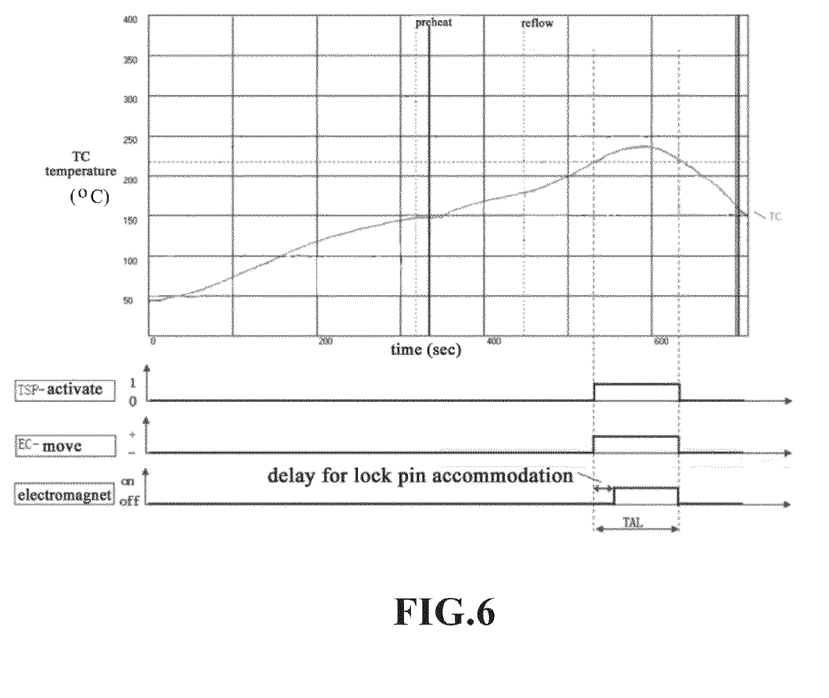
FIG. 6 shows a graph of variation of the temperature sensed by a temperature sensor during a rework hot gas heating over time in the upper portion, and shows a driving timing chart according to an illustrative embodiment in the lower portion.

FIG. 6 shows a graph of variation of the temperature sensed by a temperature sensor during a rework hot gas heating over time in the upper portion, and shows a driving timing chart according to an illustrative embodiment in the lower portion. In the graph in the upper portion of FIG. 6, the abscissa axis indicates time, and the ordinate axis indicates temperature. As can be seen from the graph, solder is in a liquid state above the temperature TC (about 220° C.). The time-period in which solder is in a liquid state is called TAL time (Time Above Liquid). The time period TAL is projected info the driving timing chart in the lower portion of FIG. 6. In the timing chart in the lower portion of FIG. 6, the first row shows the timing sequence for the temperature signal processor to send the activate signal, the second row shows the timing sequence for the ejector controller to drive the ejector pins. According to the threshold derived from the graph as shown in FIG. 6, under the control of the temperature signal processor and the ejector controller, it is possible to drive the ejector pins only within the solder melting temperature range so as to easily eject lock pins from the circuit board. Such timing sequence control is especially critical to a successful rework for lock pin soldering type component, as the solder melting temperature range is limited and only has a certain time span.

Figure 7:
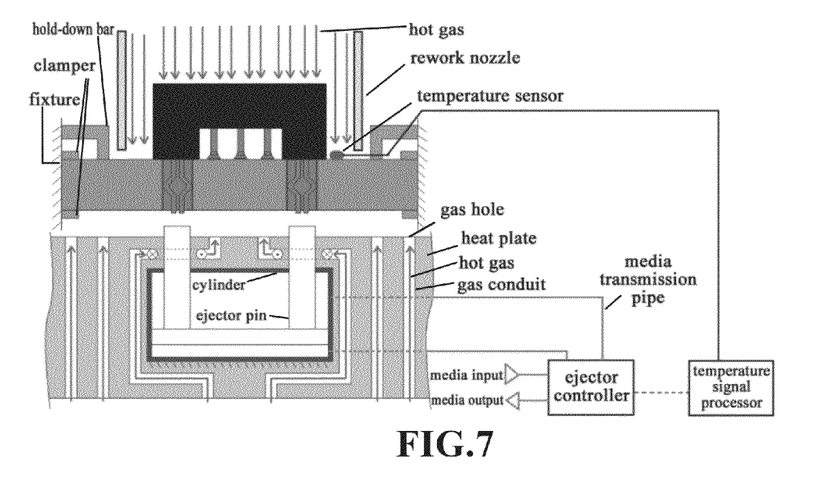
FIG. 7 is a schematic diagram showing temperature triggering ejector system for a lock pin soldering type component according to another illustrative embodiment.

FIG. 7 is a schematic diagram showing a temperature triggering ejector system for a lock pin soldering type component according to another illustrative embodiment. In the embodiment shown in FIG. 7, the temperature triggering ejector system also includes a heat plate for heating solder. In the embodiment in FIG. 7, the cylinder of the ejector is embedded in the heat plate. In another embodiment, the heat plate may be separated from the cylinder of the ejector. The heat plate may be used with the rework nozzle of the prior art (see FIG. 7), and also may be used alone. When the heat plate may be used with the rework nozzle, the circuit board can be heated from both sides so that solder is melted more rapidly. Gas conduits through which hot gas can flow are buried in the heat plate, and on the top of the heat plate, there are a plurality of gas holes which communicate with the gas conduits and can discharge hot gas to heat the solder. In positions in the heat plate that are close to the ejector pins and the cylinder, gas conduits may be designed to bypass the ejector pins and the cylinder so that interference does not occur. In one embodiment, the heat plate is designed to only heat the areas of the circuit board required for rework by arranging positions of the gas holes. In one embodiment, as describe above and as shown in FIG. 7, the ejector controller may also be equipped with a media input port and a media output port.

In one embodiment, as shown in FIG. 7, two ends of the circuit board are fixed by clampers of a fixture. The fixture further includes a hold-down bar that supports, the circuit board from the side of the circuit board that faces the component. The hold-down bar may prevent warpage of the circuit board caused by the ejector pins' ejecting motion, and flatten the circuit board. The hold-down bar is positioned near to the rework site.

In order to mitigate the damage to the PTH wall during the lock pin ejecting process, the inventor of the present invention proposes further improvements, i.e., improvements of the structure of the ejector pins. The ejector pins are designed to be able to tighten the lock pins when they contact the lock pins, so that the friction force between the lock pins and the PTH wall of the circuit board will be reduced.

Figure 8:
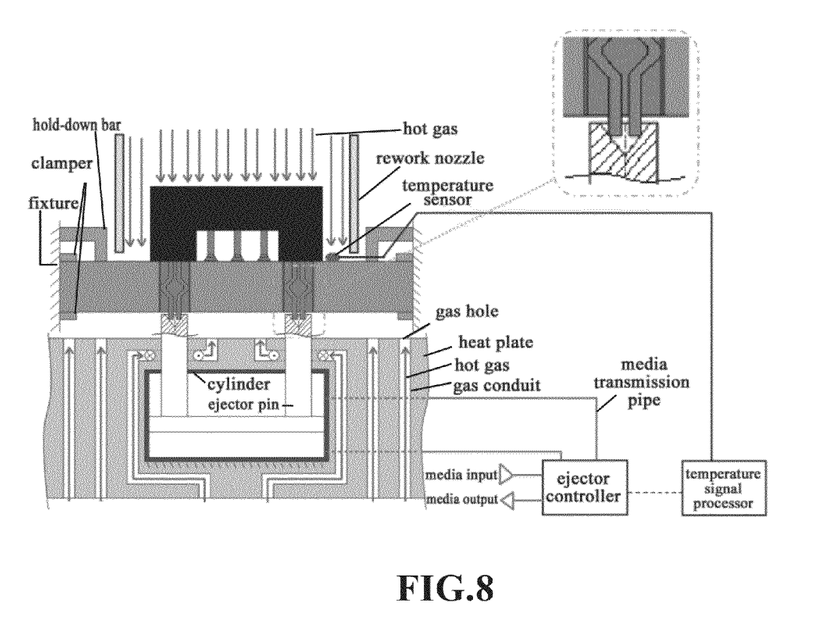
FIG. 8 is a schematic enlarged view showing an ejector pin according to an illustrative embodiment.

FIG. 8 is a schematic enlarged view showing an ejector pin according to one illustrative embodiment. In the shove embodiments, the ejector pin is in a simple cylindrical shape. In contrast to this, in FIG. 8, there is a depressed concave surface in the top of the ejector pin. Specifically, the concave surface is a cone surface, but not limited thereto, as long as it is a structure in which the upper portion is wider than the lower portion. The center of the cone surface is aligned with the center of the lock pin, and the diameter of the top opening of the cone surface is a bit larger than the width of the end of the lock pin, so that the cone surface ears accommodate the two lock pins when the ejector pin moves upward. When the two lock pins slide on the cone surface in the top of the ejector pin, the two lock pins will tighten, thus the friction force between the lock pins and the PTH wall will be reduced.

Figure 9:
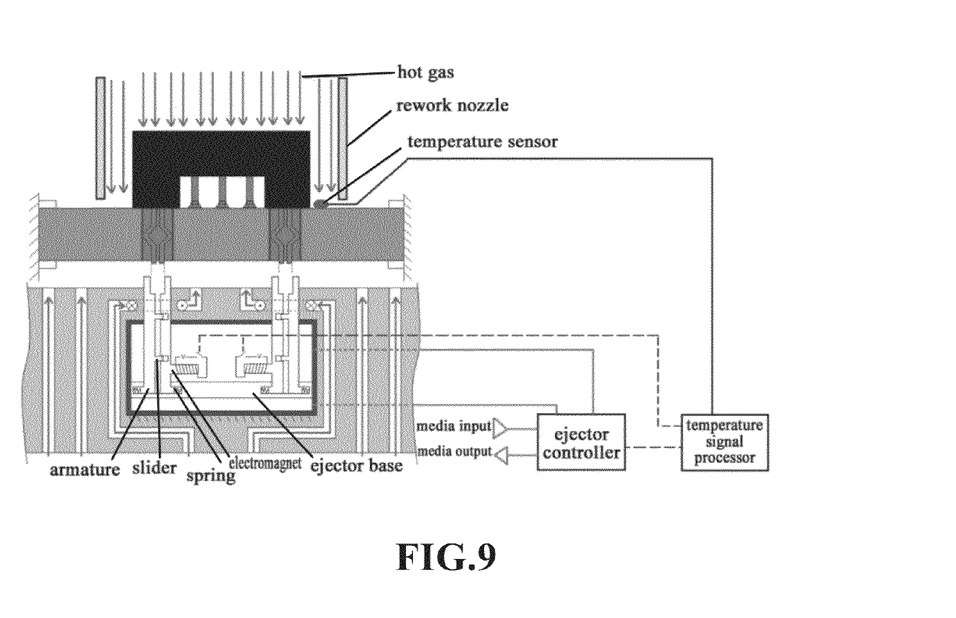
FIG. 9 is a schematic diagram showing an ejector pin according to another illustrative embodiment.

FIG. 9 is a schematic diagram showing an ejector pin according to another illustrative embodiment. As shown in FIG. 9, the ejector pin consists of two parts made of magnetic material. After one of the two parts is electrified under the control of the controller (the ejector controller), the two parts move toward each other in a direction that is approximately perpendicular to the ejecting direction due to generated magnetic attraction force, so that the lock pin located between them can be tightened. Specifically, in this embodiment, the ejector pin consists of an electromagnet and an armature. The electromagnet consists of a metal core and a coil. The coil will generate a magnetic field after a voltage V is applied to it. The applied voltage V is controlled by a switch, which is controlled by the signal from the controller (the temperature signal processor). One end of the metal core is wrapped by the coil to enhance the magnetic field, and the other end of the metal core mates with the armature, so as to form the ejector pin. Both the armature and the metal core are fixed on an ejector base with a reset spring, and they can slide toward each other. When the control switch is switched to "On", the voltage "V" is applied to the coil and the electromagnet starts to work. The armature will be magnetized and moved toward the metal core, thus generating the tightening force for the lock pins. When the control switch is switched to "Off", the magnetic attraction force vanishes, and the armature and the metal core will be pulled back to their original positions by the reset spring. In one embodiment, there are recesses respectively in the top of the two parts of the ejector pin, which can accommodate the lock pin before applying the tightening force. In one embodiment, one of the two parts of the ejector pin has one or a plurality of sliders, and the other of the two parts of the ejector pin has one or a plurality of guiding grooves mating with the sliders. The sliders and guiding grooves are used to align the two parts of the ejector pin with each other when they move toward each other.

In one embodiment, under the control of the controller (the ejector controller and the temperature signal processor), after the ejector pin starts to move in the ejecting direction for a certain period of time, one of the two parts of the ejector pin is electrified. This is to ensure that the tightening action is started only after the ejector pin moves a certain distance in the ejecting direction so that if contacts the lock pin. The last row in the timing chart in the lower portion of FIG. 6 shows this timing control. In this embodiment, the controller also sends the control signal to the control switch of the voltage V so that the electromagnet, can work in accordance with a desired timing sequence.

In one embodiment, it is also desired to control the movement speed of the ejector pin, so that the ejecting action may be performed more accurately within the solder melting temperature range. In the embodiment, the controller (the ejector controller) may also include a speed control valve to control the speed of the media flow, so that the movement speed of the ejector pin is controlled through the control of the speed of the media flow. In one embodiment, the movement speed of the ejector pin may be controlled as follows: the movement speed of the ejector pin=the circuit board thickness/TAL.

Herein, it is noted that features in various embodiments may be combined with each other, but not limited to a certain specific embodiment. For example, the heat plate in FIG. 7 may be combined with the temperature triggering ejector systems in FIGS. 4 and 5, and the fixture in FIG. 8 may be combined with the temperature triggering ejector systems in FIGS. 4-5 and 9, and so on.

Figure 10:
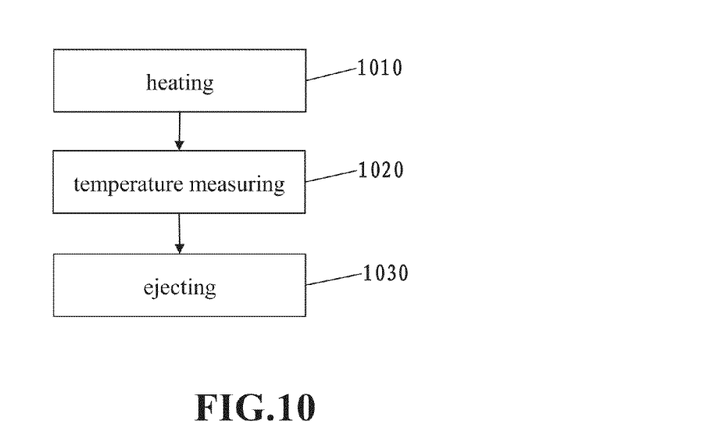
FIG. 10 is a flowchart showing a rework method for a circuit board with a lock pin soldering type component according to an illustrative embodiment.

FIG. 10 is a flowchart showing a rework method for a circuit board with a lock pin soldering type component according to an illustrative embodiment. Lock pins of the component are fixed in through holes of the circuit board and solder is filled in through holes after soldering. The method includes a heating step 1010, a temperature measuring step 1020 and an ejecting step 1030.

In the heating step 1010, a rework area in which there is solder on the circuit board is heated. In the temperature measuring step 1020, the temperature sensor is used to sense the temperature of said solder being heated. In the ejecting step 1030, ejector pins of an ejector are driven within a solder melting temperature range based on the temperature sensed by the temperature sensor, to eject lock pins of said component from said circuit board. The ejector is located at one side of the circuit board that is opposed to the component, and has ejector pins aligned with through holes of the circuit board and a cylinder that drives the ejector pins.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the term "comprises", when used in this specification, specify the presence of stated features, integers, steps, operations, elements, and/or components, but do not preclude the presence or addition of one or more other features, integers, steps, operations, elements, and/or components and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the principle of the present invention is explained in combination with embodiments thereof above, the explanation is merely exemplary and is not to be construed as limiting the present invention in any way. Those skilled in the art may make various variations and modifications in the present invention without departing from the spirit and scope of the invention defined in the appended claims.

What is claimed is:

1. A temperature triggering elector system for a lock pin soldering component, wherein lock pins of the component are fixed in through holes of a circuit board and solder is filled in the through holes, the ejector system comprising:
    an ejector located at one side of the circuit board opposed to the component, wherein the ejector has ejector pins aligned with the through holes of the circuit board and a cylinder that drives the ejector pins;
    a temperature sensor configured to sense a temperature of the solder during heating; and
    a controller configured to drive the ejector pins of the ejector within a solder melting temperature range based on the temperature sensed by the temperature sensor to eject the lock pins of the component from the circuit board.

2. The ejector system according to claim 1, wherein the ejector uses gas or liquid within the cylinder to drive the elector pins in an ejecting direction by hydraulic pressure or pneumatic pressure under control of the controller.

3. The ejector system according to claim 1, further comprising a heat plate configured to heat the solder.

4. The ejector system according to claim 3, wherein the cylinder is embedded within the heat plate.

5. The ejector system according to claim 3, wherein gas conduits through which hot gas flow are buried in the heat plate, and a top of the heat plate comprises a plurality of gas holes that communicate with the gas conduits and discharge hot gas to heat the solder.

6. The ejector system according to claim 1, wherein the ejector pins are designed to tighten the lock pins, such that friction force between the lock pins and a through hole wall of the circuit board is reduced.

7. The ejector system according to claim 1, wherein a top of the ejector pin comprises a depressed concave surface.

8. The ejector system according to claim 7, wherein the concave surface is a cone surface.

9. The ejector system according to claim 8, wherein a diameter of a top opening of the cone surface is slightly larger than a width of an end of the lock pins.

10. The ejector system according to claim 1, wherein each ejector pin consists of two parts made of magnetic material, wherein responsive to a first part being electrified under control of the controller, the two parts move toward each other in a direction that is approximately perpendicular to an ejecting direction due to generated magnetic attraction force, such that the lock pin located between the two parts is tightened.

11. The ejector system according to claim 10, further comprising recesses respectively in a top of said two parts of the ejector pin, which can accommodate the lock pins.

12. The ejector system according to claim 10, wherein under control of the controller, responsive to the ejector pin moving in the ejecting direction for a predetermined period of time, the first part of the ejector pin is electrified.

13. The ejector system according to claim 10, wherein a first part of the ejector pin has at least one slider, and a second part of the ejector pin has at least one guiding groove mating with the at least one slider, wherein the at least one slider and the at least one guiding groove align the two parts of the ejector pin with each other as the two parts more toward each other.

14. The ejector system according to claim 1, wherein the temperature sensor is placed on any side of said circuit board.

15. The ejector system according to claim 1, wherein two ends of the circuit board are fixed by clampers of a fixture.

16. The ejector system according to claim 15, wherein the further comprises a hold-down bar that supports the circuit board from a side of the circuit board that facts the component.

* * * * *